(12) United States Patent
Sun et al.

(10) Patent No.: US 11,493,280 B2
(45) Date of Patent: Nov. 8, 2022

(54) HEAT PIPE MODULE AND HEAT DISSIPATING DEVICE USING THE SAME

(71) Applicant: COOLER MASTER CO., LTD., New Taipei (TW)

(72) Inventors: Chien-Hung Sun, New Taipei (TW); Te-Hsuan Chin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 97 days.

(21) Appl. No.: 17/147,334

(22) Filed: Jan. 12, 2021

(65) Prior Publication Data

US 2021/0131743 A1    May 6, 2021

Related U.S. Application Data

(63) Continuation of application No. 15/383,169, filed on Dec. 19, 2016, now abandoned.

(30) Foreign Application Priority Data

Mar. 1, 2016  (CN) .......................... 201610114384.9

(51) Int. Cl.
| | |
|---|---|
| *F28D 15/02* | (2006.01) |
| *H05K 7/20* | (2006.01) |
| *F28D 15/04* | (2006.01) |
| *F28F 1/02* | (2006.01) |

(52) U.S. Cl.
CPC ..... *F28D 15/0275* (2013.01); *F28D 15/0233* (2013.01); *F28D 15/04* (2013.01); *F28D 15/046* (2013.01); *F28F 1/02* (2013.01); *H05K 7/20336* (2013.01)

(58) Field of Classification Search
CPC .. F28D 15/04; F28D 15/0275; H05K 7/20336
See application file for complete search history.

(56) References Cited

U.S. PATENT DOCUMENTS

| | | | | |
|---|---|---|---|---|
| 3,618,660 | A * | 11/1971 | Busse ..................... | F28D 15/04 165/104.14 |
| 3,651,240 | A * | 3/1972 | Kirkpatrick ........... | F28D 15/046 165/104.26 |
| 4,067,315 | A * | 1/1978 | Fehlner ................... | F28D 15/04 165/104.26 |
| 8,339,786 | B2 * | 12/2012 | Cheng ................... | H01L 23/427 165/104.14 |
| 9,746,249 | B2 * | 8/2017 | Lee ........................ | F28D 15/046 |
| 2007/0240856 | A1 * | 10/2007 | Liu ........................ | F28D 15/046 165/104.26 |
| 2012/0227935 | A1 * | 9/2012 | Huang ................ | F28D 15/0275 165/104.26 |
| 2014/0060781 | A1 * | 3/2014 | Jia ....................... | F28D 15/0275 165/104.26 |

* cited by examiner

*Primary Examiner* — Leonard R Leo
(74) *Attorney, Agent, or Firm* — Maschoff Brennan

(57) ABSTRACT

A heat pipe module includes at least one first pipe body and at least one second pipe body. The inner wall of the first pipe body defines a hollow chamber. A part of the second pipe body is disposed in the hollow chamber, and the external wall of the part of the second pipe body directly contacts the first pipe body.

16 Claims, 11 Drawing Sheets

HEAT PIPE MODULE AND HEAT DISSIPATING DEVICE USING THE SAME

CROSS-REFERENCE TO RELATED APPLICATIONS

This Non-provisional application is a continuation patent application of U.S. patent application Ser. No. 15/383,169, filed on Dec. 19, 2016, which claims priority under 35 U.S.C. § 119(a) on Patent Application No(s). 201610114384.9 filed in People's Republic of China on Mar. 1, 2016, the entire contents of which are hereby incorporated by reference.

BACKGROUND

1. Technical Field

The present invention relates to a heat pipe module and a heat dissipating device using the same, which can effectively reduce the heat resistance.

2. Related Art

As the progress of technologies, the electronic apparatuses such as the notebook computer, tablet computer and smart phone as well as the CPU, GPU, antenna and battery thereof are requested to be smaller, lighter and thinner. However, these electronic components also have higher performances, so that they will generate a lot of heat. Accordingly, the heat dissipating device is an indispensable component in the electronic apparatus. In general, a heat pipe, which has a thermal conductivity better than copper or aluminum, is configured to the electronic apparatus for dissipating the generated heat and cooling the components. In the smaller, lighter and thinner electronic apparatus, the heat pipe must be correspondingly smaller, lighter and thinner.

The heat pipe is a heat dissipating unit with simple structure and good performance, so it has been widely applied in various heat dissipating devices for dissipating the heat of electronic products. The operation theory of heat pipe is to transfer energy by the latent heat of phase changes of the working fluid. In the vaporization section, the working fluid is vaporized to carry a lot of heat away. Then, the vapor of the working fluid can fulfill the entire vacuum chamber of the pipe and be condensed into liquid at the condensation section to release heat. The capillary structure (wick) in the heat pipe can transport the liquid working fluid back to the vaporization section, thereby forming a phase change cycle. The configuration can effectively remove the heat generated by the heat source away.

The thin heat pipe is a kind of the plate type heat pipe and has a working theory the same as the conventional heat pipe. Since the thin heat pipe is thinner and lighter, and has a larger area of conductive surface than the conventional heat pipe, it has been applied to many electronic products with large heat-dissipating surface. In practice, most heat is transferred by the thin heat pipe to the cooling unit such as fins or fan. However, as the increase of the space limitation of the thin electronic apparatus, the number of the cooling units is not enough for all of the heat sources. Thus, the heat dissipation of the electronic apparatus may not be fully satisfied. In addition, when the distance between the cooling unit and the heat source increases, the heat transfer ability will be sufficiently decreased. Besides, the heat resistance of the heat-dissipating device can also reduce the heat transfer efficiency of the heat pipe, which will lower the heat dissipating efficiency of the cooling units.

Therefore, it is an important subject to provide a heat pipe module and a heat dissipating device using the same that have reduced heat resistance and can be applied to multiple heat sources.

SUMMARY

In view of the foregoing, an objective of the present invention is to provide a heat pipe module and a heat dissipating device using the same that have reduced heat resistance and can be applied to multiple heat sources.

To achieve the above objective, the present invention discloses a heat pipe module, which includes at least one first pipe body and at least one second pipe body. An inner wall of the first pipe body defines a hollow chamber. A part of the second pipe body is disposed in the hollow chamber, and an external wall of the part of the second pipe body directly contacts the first pipe body.

In one embodiment, the external wall of the second pipe body directly contacts the inner wall of the first pipe body.

In one embodiment, a surface area of the inner wall of the first pipe body is larger than a surface area of the external wall of the second pipe body.

In one embodiment, the heat pipe module further includes a capillary structure disposed on the inner wall of the first pipe body.

In one embodiment, the external wall of the second pipe body directly contacts the capillary structure.

In one embodiment, the capillary structure is only configured at contact portions of the first pipe body and the second pipe body.

In one embodiment, the heat pipe module further includes a vaporization portion and a condensation portion, and the second pipe body is located at a part of the vaporization portion and all of the condensation portion.

In one embodiment, the capillary structure is disposed on an end of the inner wall of the first pipe body closing to the condensation portion.

In one embodiment, the first pipe body has a supporting structure disposed between the capillary structure and the second pipe body.

In one embodiment, the heat pipe module further includes a plurality of second pipe body disposed in the first pipe body and arranged side by side.

In one embodiment, the first pipe body is a heat pipe or a vapor chamber.

In one embodiment, the second pipe body is a heat pipe, a vapor chamber or a metal pipe.

To achieve the above objective, the present invention also discloses a heat dissipating device, which includes a heat pipe module and a heat sink. The heat pipe module includes at least one first pipe body and at least one second pipe body. An inner wall of the first pipe body defines a hollow chamber. A part of the second pipe body is disposed in the hollow chamber, and an external wall of the part of the second pipe body directly contacts the first pipe body. The heat sink has a plurality fins disposed on the second pipe body.

In one embodiment, the external wall of the second pipe body directly contacts the inner wall of the first pipe body.

In one embodiment, a surface area of the inner wall of the first pipe body is larger than a surface area of the external wall of the second pipe body.

In one embodiment, the heat pipe module further includes a capillary structure disposed on the inner wall of the first pipe body.

In one embodiment, the external wall of the second pipe body directly contacts the capillary structure.

In one embodiment, the capillary structure is only configured at contact portions of the first pipe body and the second pipe body.

In one embodiment, the heat pipe module further includes a vaporization portion and a condensation portion, and the second pipe body is located at a part of the vaporization portion and all of the condensation portion.

In one embodiment, the capillary structure is disposed on an end of the inner wall of the first pipe body closing to the condensation portion.

In one embodiment, the first pipe body has a supporting structure disposed between the capillary structure and the second pipe body.

In one embodiment, the heat pipe module further includes a plurality of second pipe body disposed in the first pipe body and arranged side by side.

In one embodiment, the first pipe body is a heat pipe or a vapor chamber.

In one embodiment, the second pipe body is a heat pipe, a vapor chamber or a metal pipe.

As mentioned above, the heat pipe module and heat dissipating device of the invention have a first pipe body and a second pipe body, which are connected (partially telescoped), so that the heat generated by the heat source can be transferred from the first pipe body to the second pipe body through the capillary structure of the first pipe body. Then, the heat can be dissipated at the second pipe body (cooling). This configuration can effectively decrease the heat resistance in the heat transfer procedure, thereby improving the heat transfer efficiency.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The present invention will be apparent from the following detailed description, which proceeds with reference to the accompanying drawings, wherein the same references relate to the same elements.

Figure 1A:
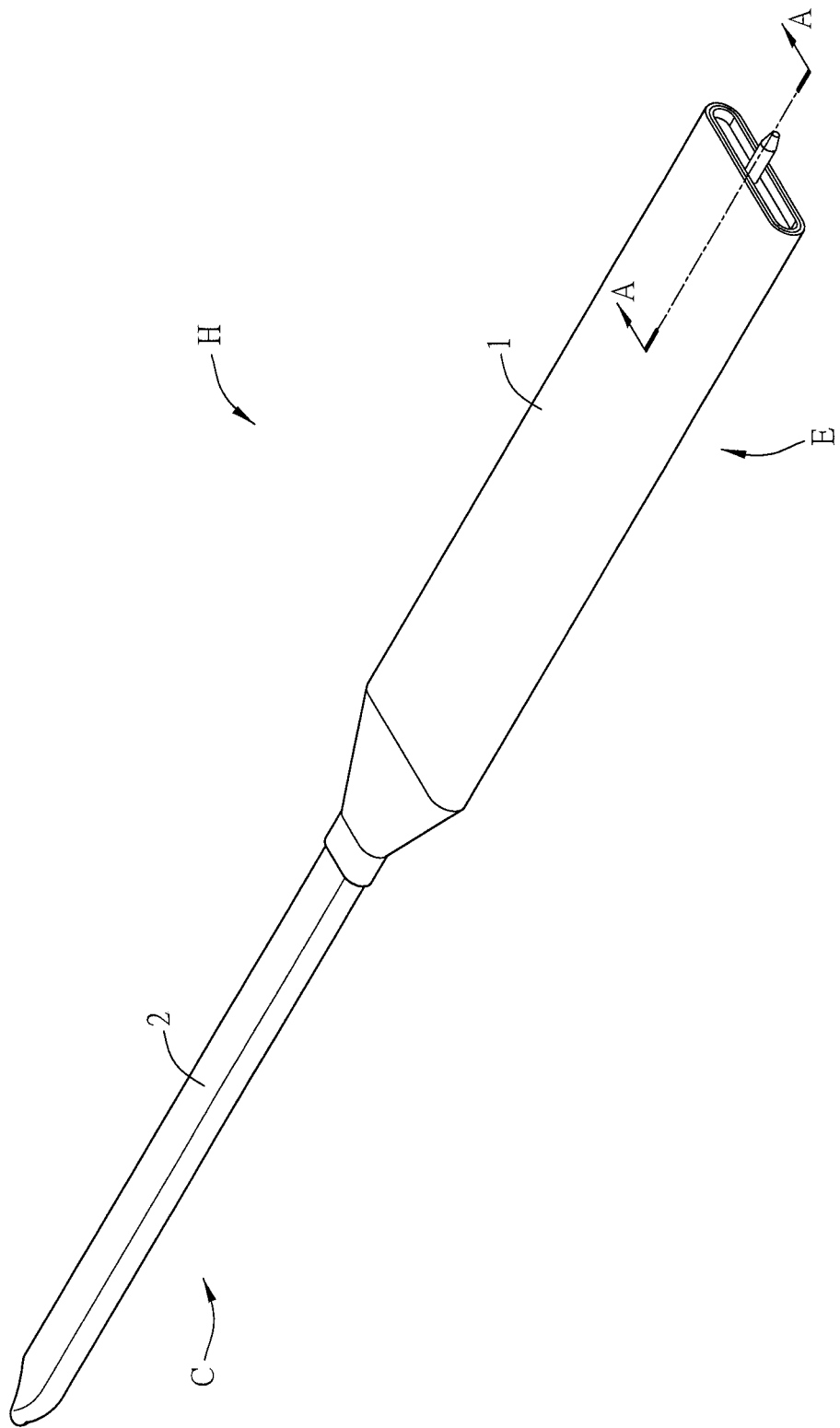
FIG. 1A is a schematic diagram of a heat pipe module according to an embodiment of the invention.
Figure 1B:
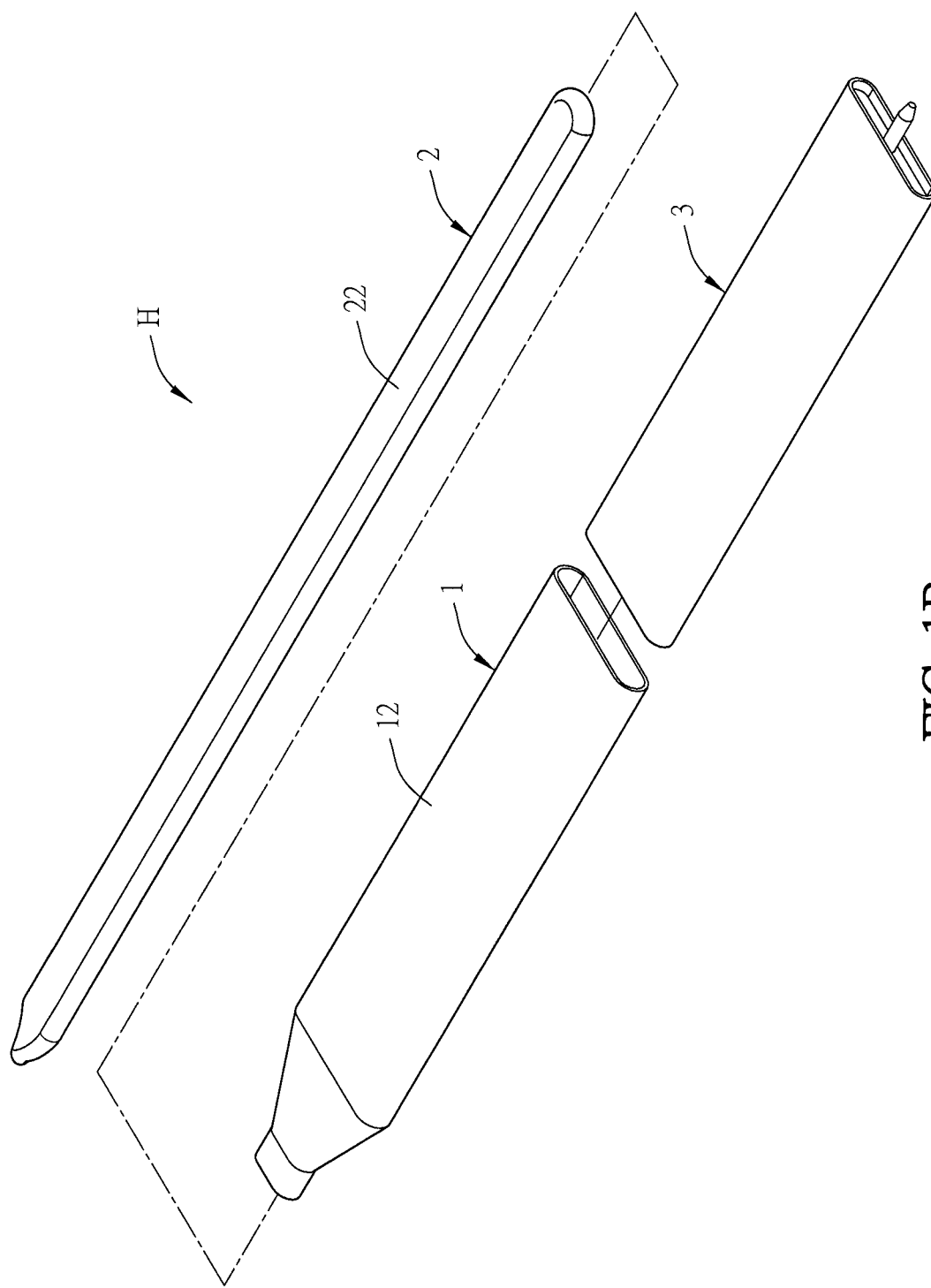
FIG. 1B is an exploded view of the heat pipe module of FIG. 1A.
Figure 1C:
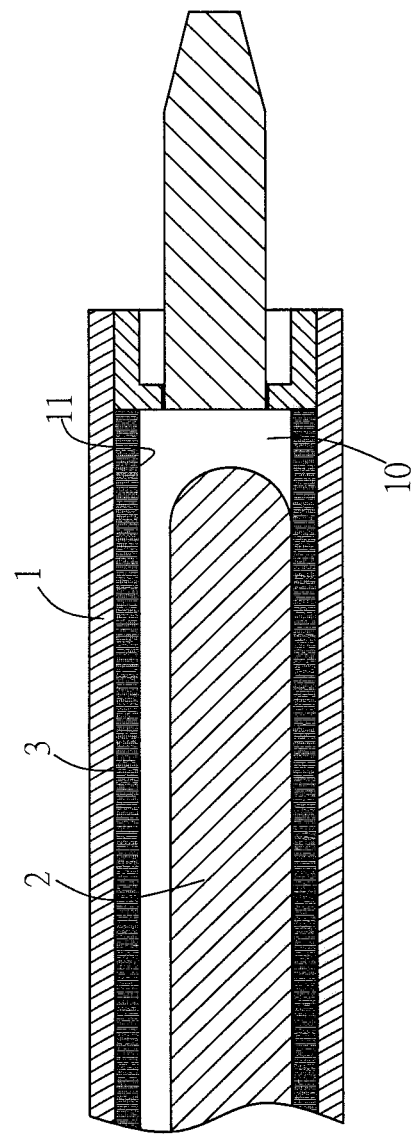
FIG. 1C is a sectional view of the heat pipe module of FIG. 1A along the line A-A.

FIG. 1A is a schematic diagram of a heat pipe module according to an embodiment of the invention, FIG. 1B is an exploded view of the heat pipe module of FIG. 1A, and FIG. 1C is a sectional view of the heat pipe module of FIG. 1A along the line A-A. Referring to FIGS. 1A, 1B and 1C, the heat pipe module H of this embodiment includes a first pipe body 1, a second pipe body 2, and a capillary structure 3. The inner wall 11 of the first pipe body 1 defines a hollow chamber 10, which penetrates through one end of the first pipe body 1. The capillary structure 3 is disposed on at least a part of the inner wall 11 of the first pipe body 1. In this embodiment, the capillary structure 3 is disposed on the entire inner wall 11 of the first pipe body 1.

The configurations and relations of the above components will be described hereinafter. With reference to FIGS. 1A to 1C, a part of the second pipe body 2 is disposed in the hollow chamber 10. In other words, not the entire second pipe body 2 is disposed in the hollow chamber 10. In practice, a part of the second pipe body 2 is protruded from the first pipe body 1. The part of the second pipe body 2, which is disposed in the hollow chamber 10, at least partially contacts with the capillary structure 3, and the capillary structure 3 is disposed between the first pipe body 1 and the second pipe body 2. Of course, the part of the second pipe body 2, which is disposed in the hollow chamber 10, may totally contact with the capillary structure 3.

In this embodiment, the heat pipe module H includes at least one first pipe body 1 and at least one second pipe body 2. In practice, the numbers of the first pipe body 1 and the second pipe body 2 can be optionally adjusted based on the requirement of heat dissipation for the electronic apparatus, and this invention is not limited.

The first pipe body 1 and the second pipe body 2 can be made of copper, silver, aluminum, their alloys or any other metal materials with good heat conductivity. The shape and size of the first pipe body 1 and the second pipe body 2 are not limited and can be determined according to the environment, space, amount of heat transfer, and temperature. To be noted, the surface area of the external wall 12 of the first pip body 1 must be larger than that of the external wall 22 of the second pipe body 2, thereby forming a heat pipe with a larger surface area mounted on another heat pipe with a smaller surface area.

The manufacturing method of the heat pipe module H of this embodiment will be described hereinafter. An elliptic or circular hollow pipe is flattened so as to form the first pipe body 1 or the second pipe body 2 (see FIGS. 1A to 1C). Then, the capillary structure 3 is formed in the first pipe body 1. In this embodiment, the manufacturing method of the capillary structure 3 is not limited. For example, the capillary structure 3 can be formed by applying metal powder on the inner wall 11 of the first pipe body 1 and then sintering the first pipe body 1. Accordingly, the capillary structure 3 can be formed on the inner wall 11 of the first pipe body 1. In practice, the capillary structure 3 can also be manufactured by fiber, mesh or their combinations depending on the requirements of manufacture processes or heat dissipation.

After forming the capillary structure 3, the second pipe body 2 is disposed in the first pipe body 1. In this embodiment, the second pipe body 2 can be fit and fixed to the capillary structure 3 of the first pipe body 1 without additional tools, so the assembling procedure becomes more convenient.

Viewing as a whole, the heat pipe module H has a vaporization section E and a condensation section C. The vaporization section E is one end of the first pipe body 1 away from the second pipe body 2, and the condensation section C is one end of the second pipe body 2 away from the first pipe body 1. The vaporization section E and the condensation section C shown in FIG. 1A is for an illustration only and is not to limit the scope thereof. In this embodiment, the capillary structure 3 is disposed on the inner wall 11 of one end of the first pipe body 1 closing to the condensation section C. The first pipe body 1 is located at the entire vaporization section E, and the second pipe body 2 is located at a part of the vaporization portion E and all of the condensation portion C. During the heat dissipating procedure, the vaporization section E (the first pipe body 1) is placed at the heat source, so that the first pipe body 1 can transfer the heat to the capillary structure 3. Then, the heat will be transferred from the capillary structure 3 to the second pipe body 2. According to this cycle, the heat pipe module H of the embodiment can transfer the heat to the cooling unit (not shown) of the electronic apparatus, such as fins or fan, thereby achieving the heat dissipation effect.

Since the heat pipe module H has two connected heat pipes of different surface areas (the first pipe body 1 and the second pipe body 2), it can effectively reduce the heat resistance during the heat transfer, thereby improving the heat transfer efficiency.

Figure 2A:
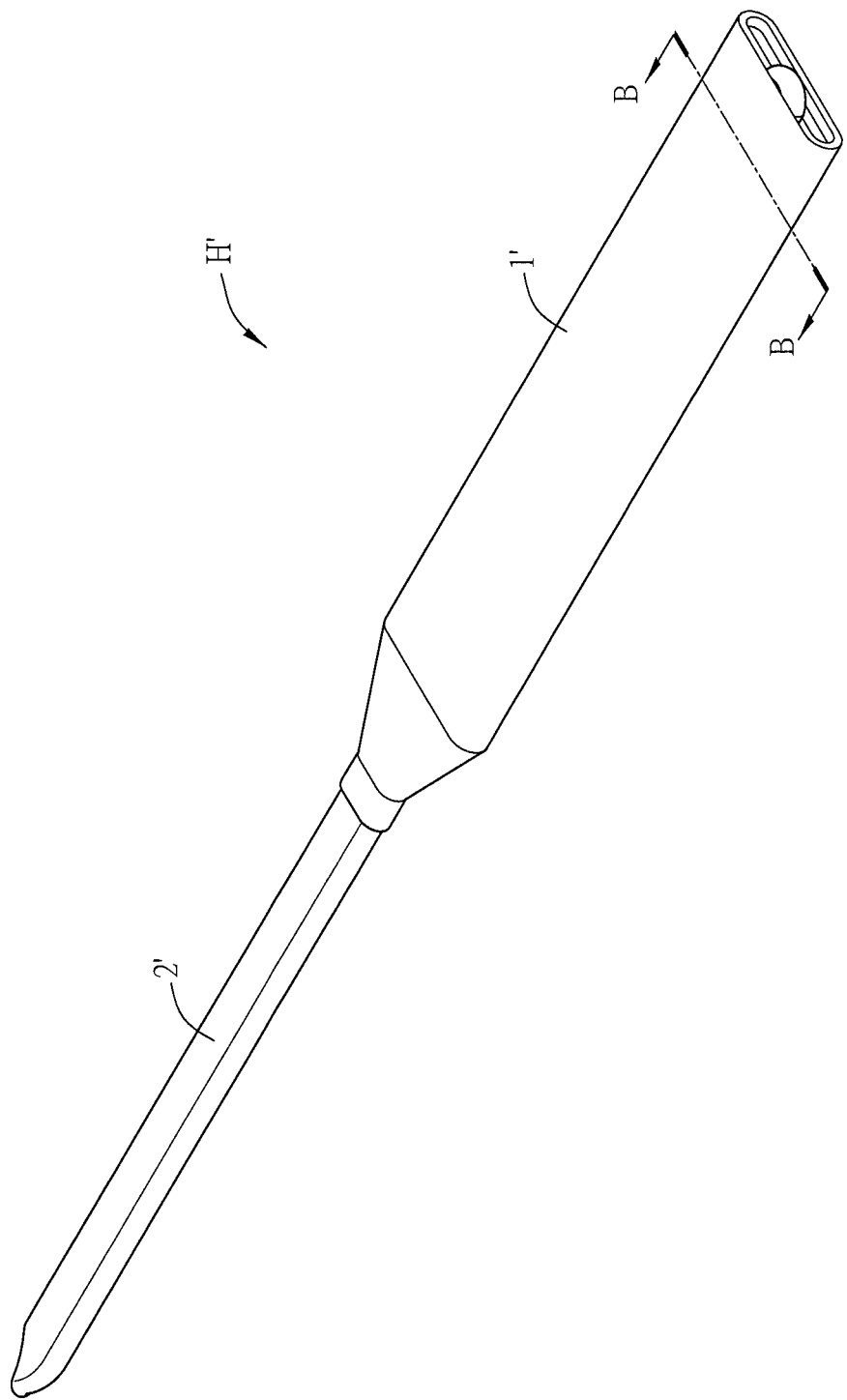
FIG. 2A is a schematic diagram of a heat pipe module according to another embodiment of the invention.
Figure 2B:
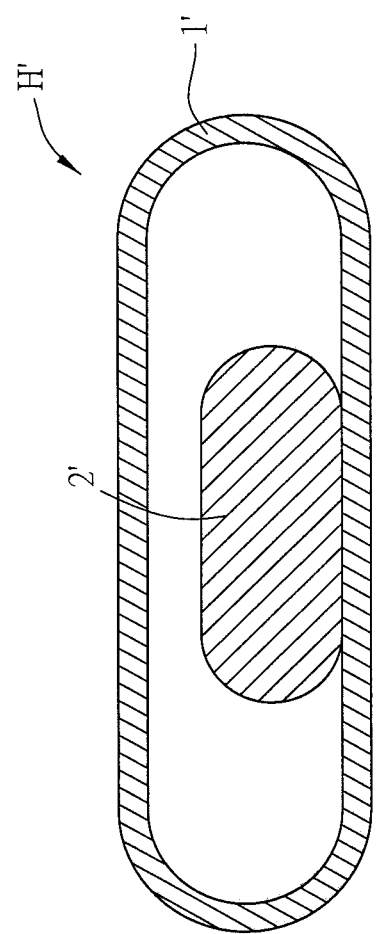
FIG. 2B is a sectional view of the heat pipe module of FIG. 2A along the line B-B.

Compared with the above-mentioned heat pipe module H, the present invention also discloses another heat pipe module H', which does not have the capillary structure. As shown in FIGS. 2A and 2B, the structures and features of the heat pipe module H' are mostly the same as that of the heat pipe module H, so the same components and connections thereof can be referred to the previous embodiment and will be omitted here. In this case, the external wall of the second pipe body 2' of the heat pipe module H' directly contacts the first pipe body P. Preferably, the external wall of the second pipe body 2' directly contacts the inner wall of the first pipe body F. The configuration can also reduce the heat resistance during the heat transfer, thereby improving the heat transfer efficiency.

Figure 2C:
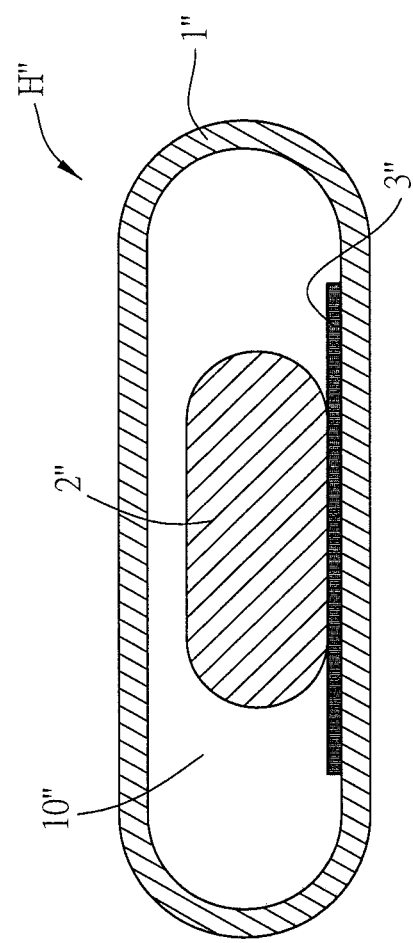
FIG. 2C is a sectional view of a heat pipe module according to another embodiment of the invention.

As shown in FIG. 2C, another heat pipe module H" also has the capillary structure 3". In this case, the second pipe body 2" disposed in the hollow chamber 10" is only partially disposed in the first pipe body 1", and the capillary structure 3" is only disposed between the first pipe body 1" and the second pipe body 2".

Figure 3:
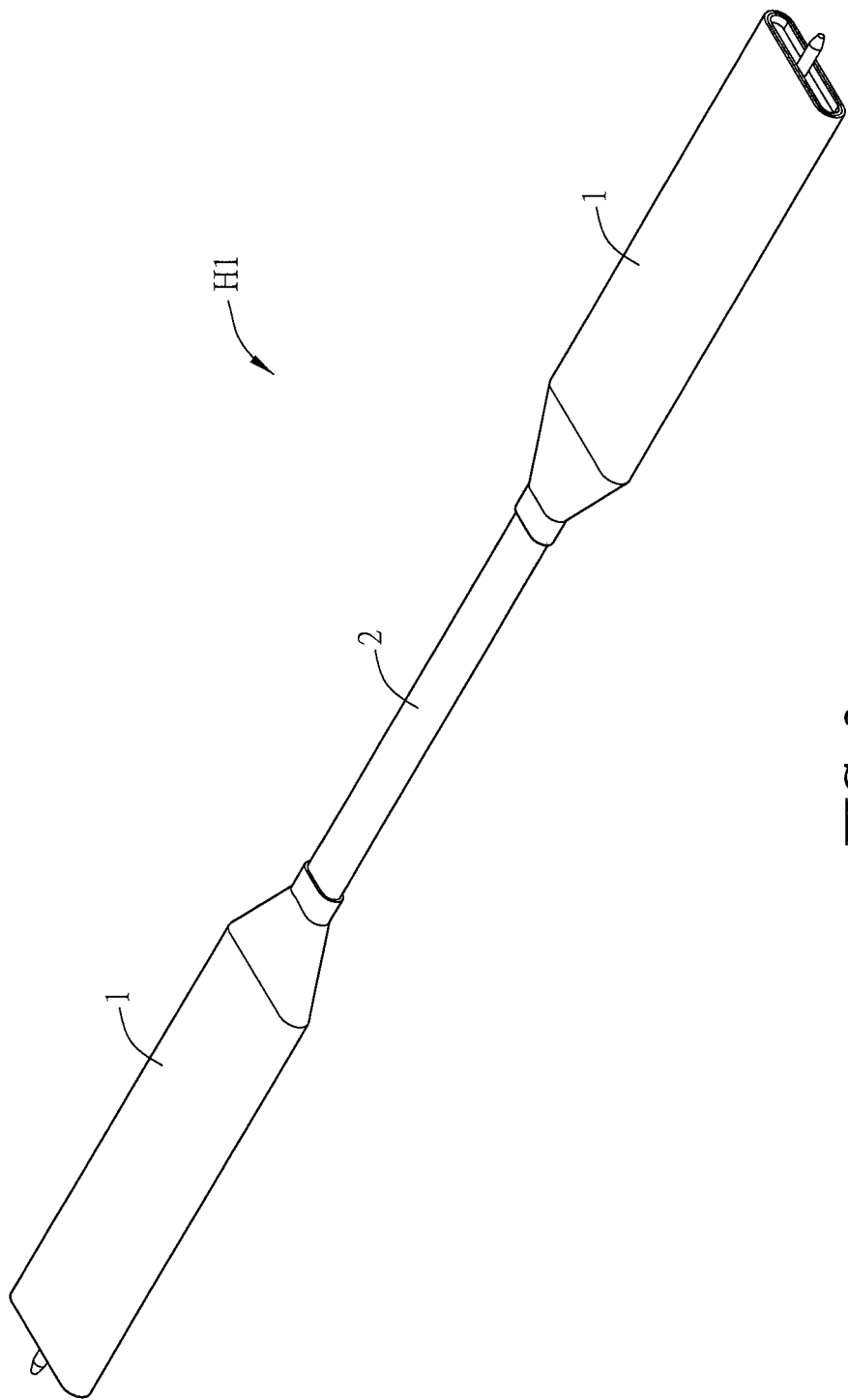
FIG. 3 is a schematic diagram of a heat pipe module according to another embodiment of the invention.

FIG. 3 is a schematic diagram of a heat pipe module according to another embodiment of the invention. As shown in FIG. 3, the structures and features of the heat pipe module H 1 are mostly the same as that of the heat pipe module H, but the heat pipe module H 1 includes two first pipe bodies 1 and one second pipe body 2. In other words, the heat pipe module H 1 has two vaporization sections E, which can be placed at different heat sources, so that this heat pipe module H 1 can be applied to an electronic apparatus with multiple heat sources. For example, the electronic apparatus may be a notebook computer having CPU and GPU (heat sources). Since the internal space of the notebook computer is limited, so it may not have enough space for configuring the cooling devices at the heat sources. This invention can configure the first pip bodies 1 (the larger heat pipe) at the heat sources and transfer the heat to a single cooling unit (e.g. fins or fan), thereby sufficiently reducing the occupied space of the heat dissipating system.

Figure 4A:
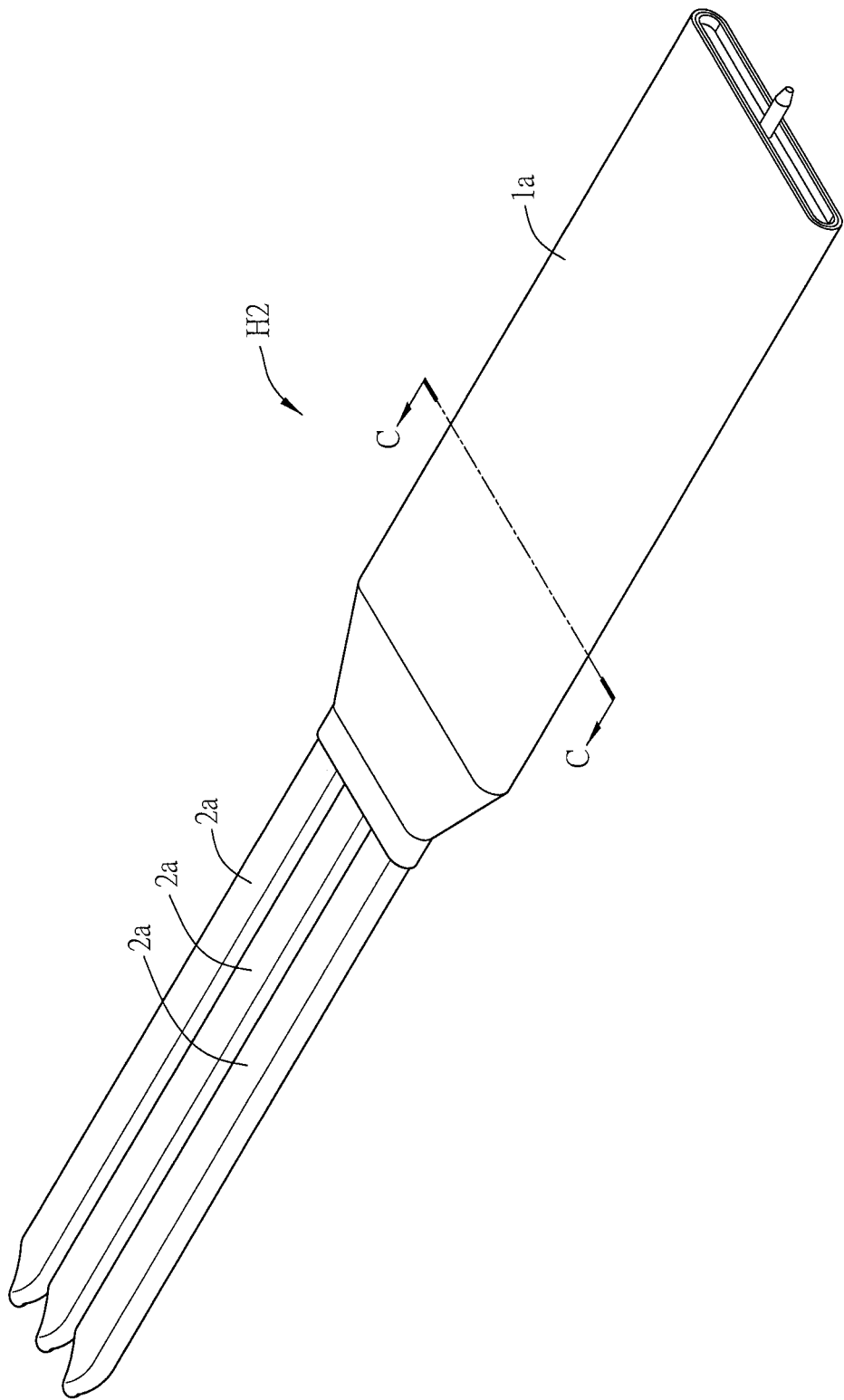
FIG. 4A is a schematic diagram of a heat pipe module according to another embodiment of the invention.
Figure 4B:
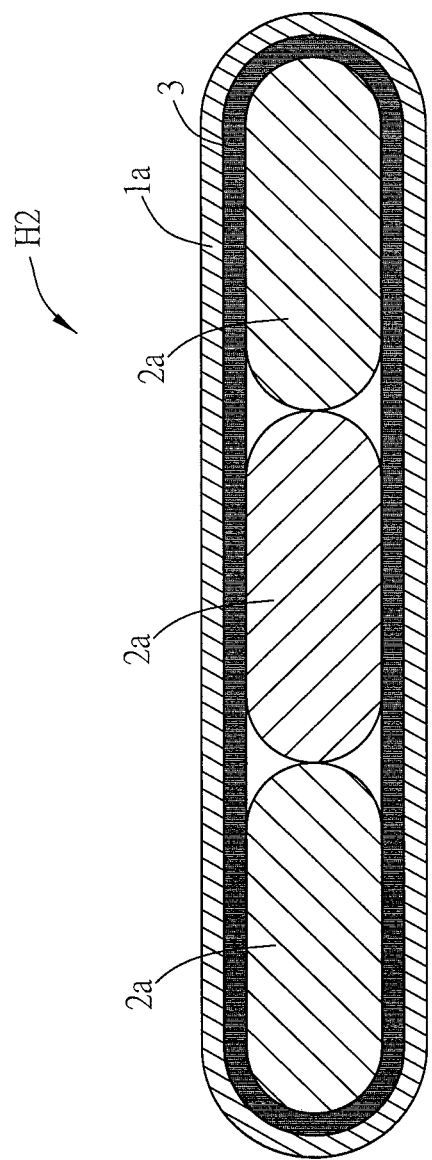
FIG. 4B is a sectional view of the heat pipe module of FIG. 4A along the line C-C.

The numbers of the first pipe bodies and the second pipe bodies can be modified depending on the applications. FIG. 4A is a schematic diagram of a heat pipe module according to another embodiment of the invention, and FIG. 4B is a sectional view of the heat pipe module of FIG. 4A along the line C-C. Referring to FIGS. 4A and 4B, the structures and features of the heat pipe module H 2 are mostly the same as that of the heat pipe module H, but the heat pipe module H 2 includes one first pipe body 1a and a plurality of second pipe bodies 2 a. In this embodiment, the heat pipe module H 2 includes three second pipe bodies 2 a. The second pipe bodies 2 a are arranged side by side in the first pipe body 1a, and are fit and fixed to the capillary structure 3. The configuration of the first pipe body 1a and the second pipe bodies 2 a can provide more heat dissipating channels, which can improve the heat dissipating effect of the heat pipe module H2 and the flexibility of the space configuration.

Figure 5A:
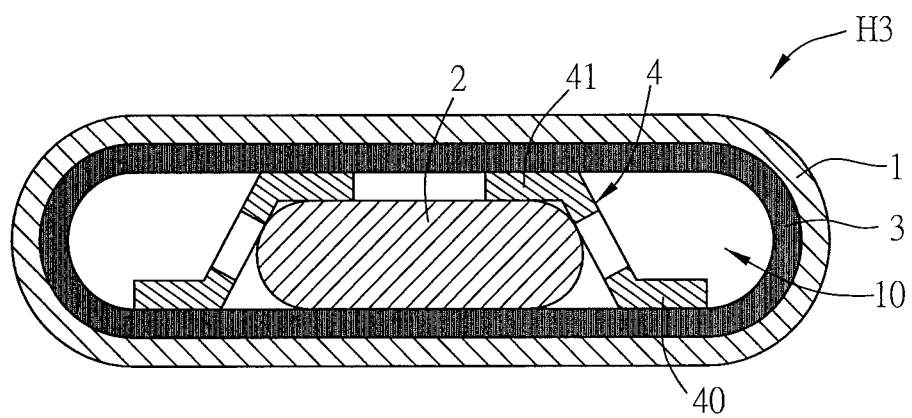
FIG. 5A is a schematic diagram of a heat pipe module according to another embodiment of the invention.

FIG. 5A is a schematic diagram of a heat pipe module according to another embodiment of the invention. As shown in FIG. 5A, the structures and features of the heat pipe module H 3 are mostly the same as that of the heat pipe module H, but the heat pipe module H 3 further includes a supporting structure 4 attaching to the capillary structure 3 and located in the hollow chamber 10. The supporting structure 4 includes a base portion 40 and a plurality of stand portion 41 protruded from the base portion 40. Each stand portion 41 has a hollow structure and is communicated with the other side of the base portion 40. The second pipe body 2 is disposed inside the supporting structure 4. The configuration of the supporting structure 4 can effectively maintain the hollow chamber 10 of the flattened first pipe body 1 and provide a better rigidity for the heat pipe module H3. In addition, the configuration of the supporting structure 4 can further divide the internal space of the first pipe body 1 into several chambers for accommodating different second pipe bodies 2, so that the vapor and liquid in different chambers can be operated dependently.

Figure 5B:
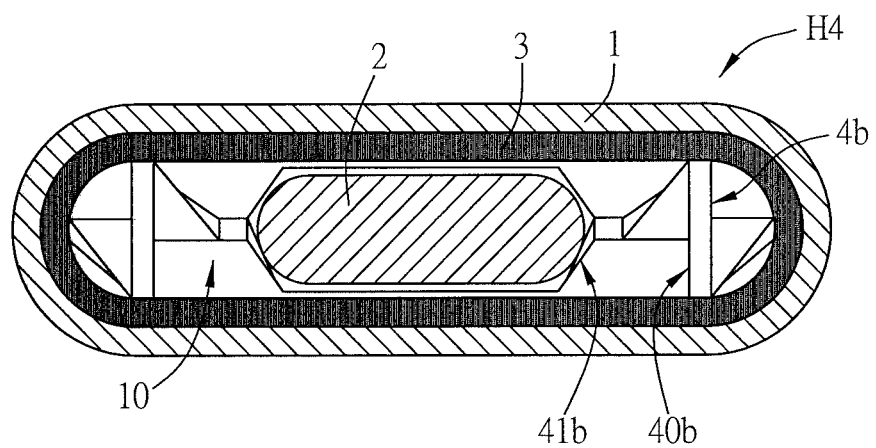
FIG. 5B is a schematic diagram of a heat pipe module according to another embodiment of the invention.

The structure of the supporting structure is not limited to the above embodiment. As shown in FIG. 5B, the supporting structure 4b is formed by punching and bending a plate (e.g. a metal plate). The supporting structure 4b includes bone portions 40 b and a supporting portion 41 b disposed between two bone portions 40b. The second pipe body 2 is disposed inside the supporting structure 4. Similarly, the configuration of the supporting structure 4b can effectively maintain the hollow chamber 10 of the flattened first pipe body 1 and provide a better rigidity for the heat pipe module H4.

Figure 6:
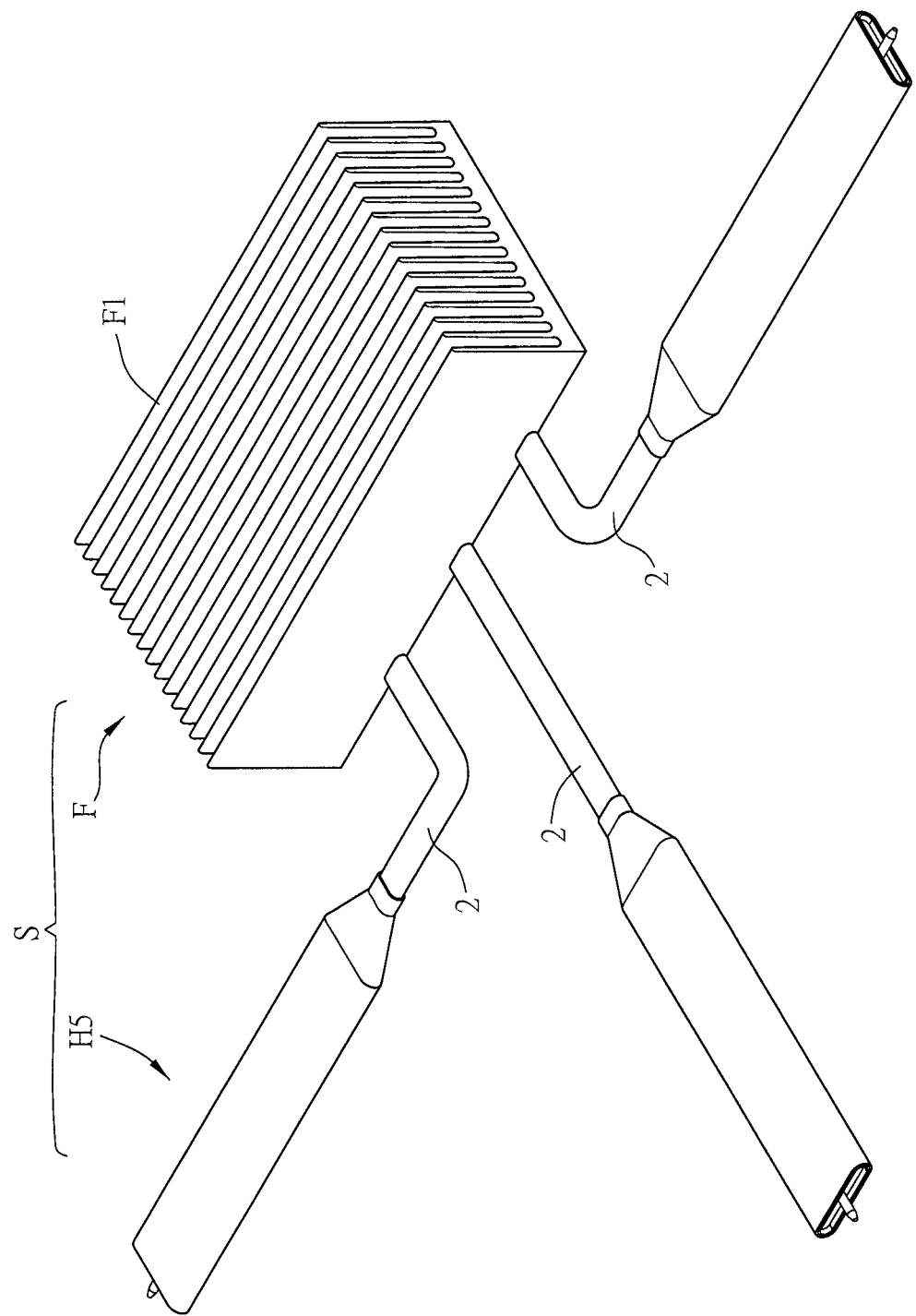
FIG. 6 is a schematic diagram of a heat dissipating device according to an embodiment of the invention.

FIG. 6 is a schematic diagram of a heat dissipating device according to an embodiment of the invention. Referring to FIG. 6, the heat dissipating device S includes a heat pipe module H 5 and a heat sink F. The structure and features of the heat pipe module H 5 can be referred to the above heat pipe module H, so the detailed descriptions thereof will be omitted. The heat sink F includes a plurality of fins F 1, which is disposed on the second pipe body 2. The fins F 1 are connected by the heat conducting sections between the fins F 1. Since the thickness of the heat conducting section is thicker than that of the heat dissipating section, the heat conducting section can form a heat transfer route with larger loading surface. This configuration can speed the transmission of the heat from the heat source to the heat sink F, which is then dissipated through the fins F 1, thereby sufficiently improving the heat dissipation performance.

In summary, the heat pipe module and heat dissipating device of the invention have a first pipe body and a second pipe body, which are connected (partially telescoped), so that the heat generated by the heat source can be transferred from the first pipe body to the second pipe body through the capillary structure of the first pipe body. Then, the heat can be dissipated at the second pipe body (cooling). This configuration can effectively decrease the heat resistance in the heat transfer procedure, thereby improving the heat transfer efficiency.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat pipe module, comprising:
   a first pipe body, wherein an inner wall of the first pipe body defines a hollow chamber;
   a second pipe body, wherein a part of the second pipe body is disposed in the hollow chamber;
   a capillary structure disposed on the inner wall of the first pipe body, wherein an external wall of the second pipe body contacts the capillary structure;
   a working fluid, disposed within at least one of the first pipe body and the second pipe body; and
   a supporting structure located in the hollow chamber and disposed between the capillary structure and the second pipe body;
   wherein the supporting structure comprises a base portion and a stand portion protruding from the base portion, the base portion and the stand portion respectively contact opposite sides of the capillary structure, and the stand portion defines a space accommodating the second pipe body.

2. The heat pipe module of claim 1, wherein a surface area of the inner wall of the first pipe body is larger than a surface area of the external wall of the part of the second pipe body in the hollow chamber, and part of the capillary structure is spatially spaced apart from the external wall of the part of the second pipe body in the hollow chamber.

3. The heat pipe module of claim 1, further comprising:
   a vaporization portion and a condensation portion, wherein the vaporization portion is on the first pipe body and away from the second pipe body, the condensation portion is on the second pipe body and away from the first pipe body, the working fluid is disposed within the first pipe body and the second pipe body, and the second pipe body is located at a part of the vaporization portion and all of the condensation portion.

4. The heat pipe module of claim 3, wherein the capillary structure is disposed on an end of the inner wall of the first pipe body closer to the condensation portion.

5. The heat pipe module of claim 1, wherein the first pipe body is a heat pipe or a vapor chamber.

6. The heat pipe module of claim 1, wherein the second pipe body is a heat pipe, a vapor chamber or a metal pipe.

7. The heat pipe module of claim 1, wherein the supporting structure directly contacts the second pipe body.

8. The heat pipe module of claim 7, wherein the supporting structure directly contacts the capillary structure.

9. A heat dissipating device, comprising:
   a heat pipe module comprising a first pipe body and a second pipe body, a capillary structure and a supporting structure, wherein an inner wall of the first pipe body defines a hollow chamber, a part of the second pipe body is disposed in the hollow chamber, the capillary structure is disposed on the inner wall of the first pipe body, an external wall of the second pipe body contacts the capillary structure, the supporting structure is located in the hollow chamber and disposed between the capillary structure and the second pipe body;
   a working fluid, disposed within at least one of the first pipe body and the second pipe body; and
   a heat sink having a plurality of fins disposed on the second pipe body;
   wherein the supporting structure comprises a base portion and a stand portion protruding from the base portion, the base portion and the stand portion respectively contact opposite sides of the capillary structure, and the stand portion defines a space accommodating the second pipe body.

10. The heat dissipating device of claim 9, wherein a surface area of the inner wall of the first pipe body is larger than a surface area of the external wall of the part of the second pipe body in the hollow chamber, and part of the capillary structure is spatially spaced apart from the external wall of the part of the second pipe body in the hollow chamber.

11. The heat dissipating device of claim 9, further comprising:
    a vaporization portion and a condensation portion, wherein the vaporization portion is on the first pipe body and away from the second pipe body, the condensation portion is on the second pipe body and away from the first pipe body, the working fluid is disposed within the first pipe body and the second pipe body, and the second pipe body is located at a part of the vaporization portion and all of the condensation portion.

12. The heat dissipating device of claim 11, wherein the capillary structure is disposed on an end of the inner wall of the first pipe body closer to the condensation portion.

13. The heat dissipating device of claim 9, wherein the first pipe body is a heat pipe or a vapor chamber.

14. The heat dissipating device of claim 9, wherein the second pipe body is a heat pipe, a vapor chamber or a metal pipe.

15. The heat dissipating device of claim 9, wherein the supporting structure directly contacts the second pipe body.

16. The heat dissipating device of claim 15, wherein the supporting structure directly contacts the capillary structure.

* * * * *